United States Patent
Moser et al.

(10) Patent No.: US 7,639,718 B1
(45) Date of Patent: Dec. 29, 2009

(54) OUTPUT COUPLER FOR EXTERNAL CAVITY LASER

(75) Inventors: Christophe Moser, Pasadena, CA (US); Gregory J. Steckman, Glendora, CA (US)

(73) Assignee: Ondax, Inc, Monrovia, CA (US)

( * ) Notice: Subject to any disclaimer, the term of this patent is extended or adjusted under 35 U.S.C. 154(b) by 0 days.

(21) Appl. No.: 11/986,739

(22) Filed: Nov. 26, 2007

Related U.S. Application Data

(60) Provisional application No. 60/860,628, filed on Nov. 22, 2006.

(51) Int. Cl.
*H01S 3/10* (2006.01)

(52) U.S. Cl. .............................. 372/21; 372/22; 372/102

(58) Field of Classification Search .................. 372/105, 372/21, 22
See application file for complete search history.

(56) References Cited

U.S. PATENT DOCUMENTS

| | | | |
|---|---|---|---|
| 5,517,525 A * | 5/1996 | Endo et al. .................... | 372/21 |
| 5,691,989 A | 11/1997 | Rakuljic et al. | |
| 7,248,618 B2 * | 7/2007 | Volodin et al. .............. | 372/102 |
| 7,359,420 B2 * | 4/2008 | Shchegrov et al. ..... | 372/50.124 |

OTHER PUBLICATIONS

Joseph W. Goodman, Introduction to Fourier Optics, 1968, pp. 198-224.
Herwig Kogelnik, Coupled Wave Theory for Thick Hologram Gratings, The Bell System Tech. Journal, Nov. 1969, vol. 48, No. 9, pp. 2909-2947.

* cited by examiner

*Primary Examiner*—Dung T Nguyen

(57) ABSTRACT

The disclosed invention is an external cavity laser with a volume holographic VHG output coupler. The facet of the VHG is coated with a very high reflectivity coating (HR close to 100%) for the purpose of reflecting the second harmonic (SH) light generated intra-cavity. The HR coating for the SH light has also an anti-reflection (AR) coating at the fundamental wavelength. The reflected second harmonic (SH) light is either reflected directly out of the cavity by the VHG or back to the cavity towards the optics that deflect the SH light out of the cavity.

19 Claims, 4 Drawing Sheets

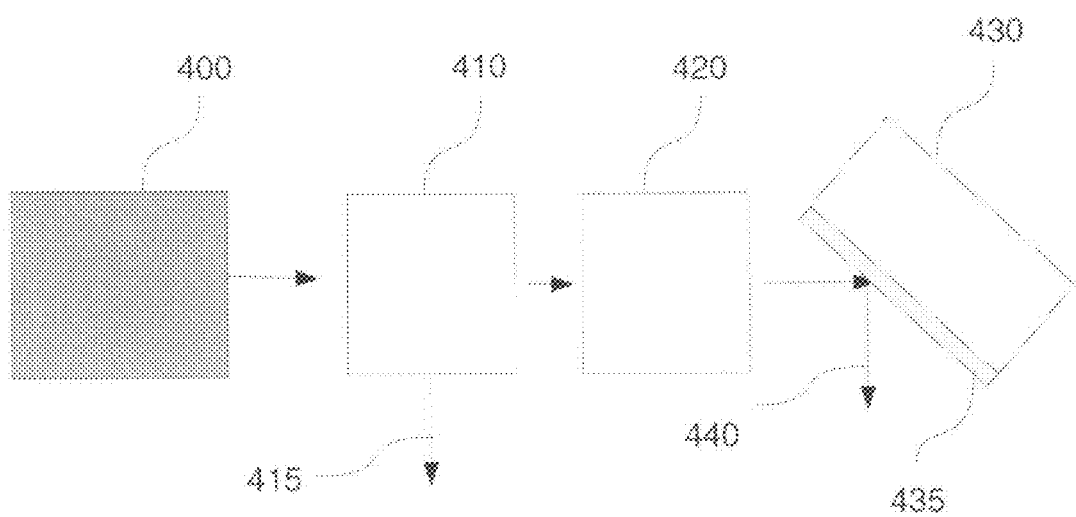

OUTPUT COUPLER FOR EXTERNAL CAVITY LASER

RELATED APPLICATION

This patent application claims priority to provisional patent application 60/860,628 filed on Nov. 22, 2006 and incorporated by reference herein in its entirety.

BACKGROUND OF THE INVENTION

1. Field of the Invention

The present invention relates to external cavity lasers with intra-cavity frequency doubling.

Portions of the disclosure of this patent document contain material that is subject to copyright protection. The copyright owner has no objection to the facsimile reproduction by anyone of the patent documents or the patent disclosure as it appears in the Patent and Trademark Office file or records, but otherwise reserves all copyright rights whatsoever.

2. Background Art

Volume Holographic Gratings (VHGs) also known as Volume Bragg Gratings (VBG) or Bragg mirrors are produced by a holographic process. Holography is the process of recording phase information into a material that is sensitive to the intensity of the incident illumination ("Introduction to Fourier Optics", J. W. Goodman, McGraw-Hill, 1968). Early materials were primarily photographic films, but modern photorefractive materials additionally include dichromated gelatin films, $LiNbO_3$ and other crystals, polymers, and glasses. Amplitude and phase information can be recorded through the interference of mutually coherent signal and reference beams.

When the signal and reference beams are simple plane waves, the material records the single sinusoidal intensity pattern formed by their interference. The grating is referred to by its grating vector (normal to the plane of constant index), which has a grating magnitude and orientation. The magnitude is the refractive index modulation depth for materials that contain phase gratings, and is the absorption modulation for materials that contain amplitude gratings. The orientation is determined by the angle between the recording beams and the recording material. If the signal or reference beam, or both, are not simple plane waves but rather carry information in the form of phase or intensity variations, then the recorded hologram can be thought of as being composed of many superimposed individual gratings each recorded by pairs of plane waves from the Fourier decomposition of the recording beams. A description of this process is found in the reference by J. W. Goodman noted above.

Holographic recording can be used with thin or thick media. When the material in which the hologram is present is thick, then Bragg selectivity occurs ("Coupled Wave Theory for Thick Hologram Gratings", H. Kogelnik, The Bell System Tech. J. 48:9, 1969). Volume hologram reflection gratings have been shown to be an extremely accurate and temperature-stable means of filtering a narrow passband of light from a broadband spectrum. This technology has been demonstrated in practical applications where narrow full-width-at-half-maximum (FWHM) passbands are required. Furthermore, such filters have arbitrarily selectable wavefront curvatures, center wavelengths, and output beam directions.

Others have described VHGs as output coupler of an external cavity laser (U.S. Pat. No. 5,691,989). In the case of an external cavity laser with intra-cavity frequency doubling, the VHG can also be used as output coupler of a laser cavity (US 2006/0029120; US 7,248,618). These patents describe a method by which a non-linear material such as a periodic poled lithium niobate (ppln) or a periodically poled lithium tantalite (pplt) is inserted in between a laser diode and a reflective VHG which acts as the output coupler. The second harmonic light generated by the ppln or pplt, via the so-called intra-cavity frequency doubling, passes through the output coupler VHG. Because the optical loss of the VHG, caused by absorption and scattering at the second harmonic can be quite high (20% or more), it is desirable to have an output coupler VHG design that prevents the second harmonic light from passing through the VHG.

SUMMARY OF THE INVENTION

The invention disclosed here prevents the second harmonic light from passing through the VHG. The facet of the output coupler VHG is coated to reflect the second harmonic light with very high efficiency (close to 100%) while maintaining a low reflectivity (typically 0.2% or less) at the fundamental wavelength. The VHG's facet is tilted with respect to the fundamental and second harmonic beam direction and the grating vector of the VHG is slanted so as to retro-reflect the fundamental beam back into the cavity.

The second harmonic (SH) light can be reflected out of the cavity by choosing the appropriate tilt angle between the VHG's facet normal and the direction of the fundamental and second harmonic beams.

The second harmonic (SH) light can be reflected back towards the laser cavity to an optical component placed in the path of the fundamental and second harmonic beams between the laser diode and non-linear material in such a way that the said optical component which is coated to reflect the second harmonic light with high efficiency (close to 100%) reflects the second harmonic beam out of the cavity. The said optical component is also coated to transmit the fundamental wavelength with low loss (typically less than approximately 0.2%).

BRIEF DESCRIPTION OF THE DRAWINGS

These and other features, aspects and advantages of the invention will become better understood with regard to the following description, appended claims and accompanying drawings where:

FIG. 4 is an external cavity with internal frequency doubling. The output coupler is a retro reflective volume holographic grating. The facet of the VHG makes an angle of approximately 45 degrees with respect to the intracavity beams (fundamental and second harmonic). The grating vector is slanted such that the fundamental wave is retro-reflected back into the cavity. To prevent the SHG light from passing through the VHG, the facet of the VHG is coated with an HR coating at the second harmonic (SH) and an AR coating at the fundamental wavelength.

DETAILED DESCRIPTION OF THE INVENTION

In the following description of the invention, reference is made to the accompanying drawings that form a part hereof, and in which is shown by way of illustration a specific embodiment in which the invention may be practiced. It is to be understood that other embodiments may be utilized and structural changes may be made without departing from the scope and spirit of the invention.

Figure 1:
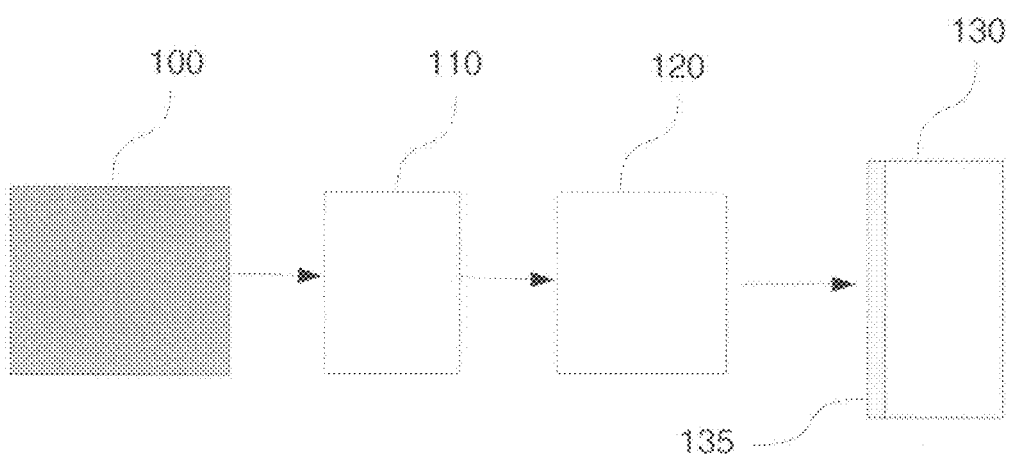
FIG. 1 (prior art) shows an external cavity with internal frequency doubling. The laser cavity is composed of a laser diode 100, beam forming optics 110, a second harmonic crystal 120 and a volume holographic grating 130. The output coupler 130 is a retro reflective volume holographic grating with an anti-reflection coating 135 for the second harmonic and fundamental beams. The second harmonic light from 120 passes through the VHG.
Figure 2:
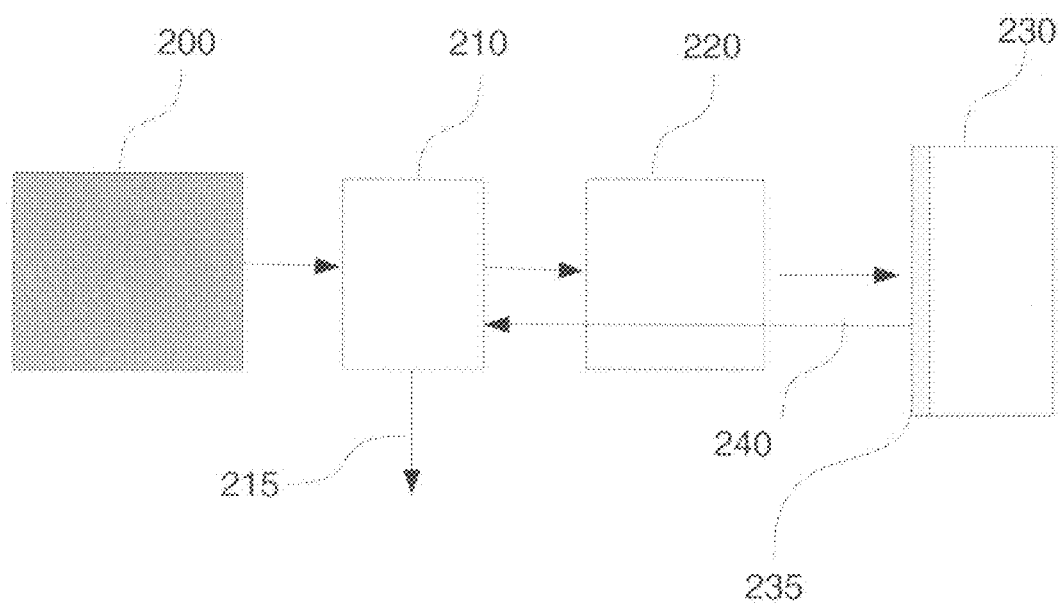
FIG. 2 shows an external cavity with internal frequency doubling. The output coupler is a retro reflective volume holographic grating. The grating vector is orthogonal to the VHG's facet. To prevent the second harmonic light from passing through the VHG, the facet of the VHG is coated with an HR coating at the second harmonic (SH) and an AR coating at the fundamental wavelength.

FIG. 2 shows an example of one embodiment of the invention. The back facet of the laser 200 forms one end of the laser cavity and the VHG 230 forms the other end. Inside the cavity is a non-linear material 220 (second harmonic generation (SHG) crystal such as periodically poled lithium niobate or periodically poled lithium tantalate). Between the laser 200 and the SHG crystal 220 are beam forming optics 210 to deflect the second harmonic beam as well as collimating and focusing optics to form a stable cavity. The facet 235 of the VHG 230 facing the inside of the cavity has a high reflectivity (HR) coating for the SH wavelength and an anti-reflection (AR) coating for the fundamental wavelength. The SH light 240 is reflected back into the cavity and deflected off of the cavity (beam 215) by the appropriate optical component 210 (for example, but not limited to, a dichroic filter placed a 45 degrees).

Figure 3:
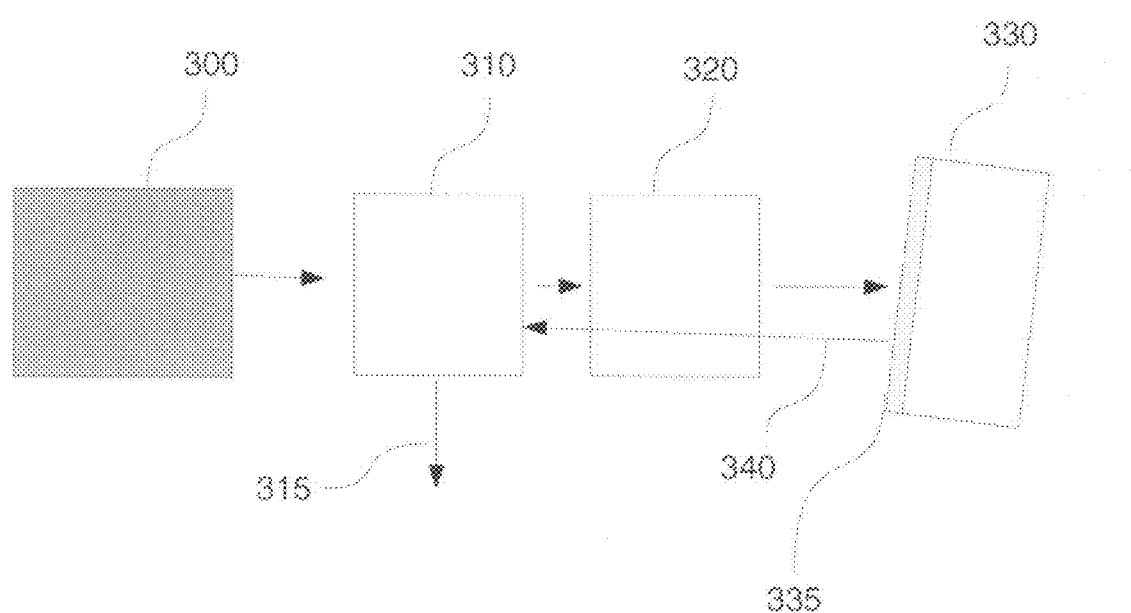
FIG. 3 is an external cavity with internal frequency doubling. The output coupler is a retro reflective volume holographic grating. The grating vector makes an angle different than zero with respect to the normal to the facet. To prevent the SHG light from passing through the VHG, the facet of the VHG is coated with a high reflectivity (HR) coating at the second harmonic (SH) and an anti-reflective (AR) coating at the fundamental wavelength.

FIG. 3 shows another example of one embodiment of the invention. Except for the orientation of the VHG, the other cavity elements are the same as FIG. 2. The normal of the facet 335 of the VHG 330 makes a non zero angle with respect to the intra-cavity fundamental beam. The grating vector of the VHG 330 is slanted such that the fundamental light is retro-reflected back into the cavity. The facet 335 of the VHG 330 facing the inside of the cavity has a high reflectivity (HR) coating for the SH wavelength and an anti-reflection (AR) coating for the fundamental wavelength. The SH light 340 is reflected back into the cavity and deflected off of the cavity (beam 315) by the appropriate optical component 310 (for example, but not limited to, a dichroic filter placed a 45 degrees). The SH light 340 propagating from East to West is deflected at angle with respect to the SH reflected by the VHG 330. In the first embodiment, the angle is nearly zero between the two SH beams and interference might occur. The second embodiment prevents interference by angularly separating the beams.

FIG. 4 shows another example of one embodiment of the invention. Except for the orientation of the VHG 430, the other cavity elements are the same as FIGS. 3 and 4. The normal of the facet 435 of the VHG 430 is at an angle with respect to the intra-cavity beam 440. The grating vector of the VHG 430 is slanted such that the fundamental light is retro-reflected back into the cavity. The facet 435 of the VHG 430 facing the inside of the cavity has a high reflectivity (HR) coating for the SH wavelength and an anti-reflection (AR) coating for the fundamental wavelength. The SH light 440 is deflected out of the cavity by the HR facet coating 435 of the VHG 430. The SH light 415 propagating towards the laser escapes the cavity via component 410 (for example, but not limited to, a dichroic filter placed at 45 degrees). In this embodiment the SH light escapes from the cavity at two distinct locations.

The invention claimed is:

1. An apparatus for generating a second harmonic beam via intra-cavity frequency doubling, the apparatus comprising:
   a laser diode having a back facet, forming one end of the optical cavity, a front facet, a gain medium between the back and front facet wherein first light is generated, the first light having a fundamental wavelength and spectral bandwidth;
   a reflective, non dispersive, volume holographic grating forming the other end of the laser cavity, the volume holographic grating having a front facet facing the laser cavity comprising an anti-reflection coating for the first fundamental light and a high reflection coating for the second harmonic light, the normal to the front facet of the volume holographic grating making an angle approximately 45 degrees with respect to the direction of the first fundamental light;
   a non-linear second harmonic crystal positioned between the laser diode and the reflective volume holographic element generating the second harmonic light;
   Wherein the volume holographic element receives first fundamental light and diffracts the first fundamental light back to the laser diode, the diffracted light having a narrower bandwidth than the fundamental light and a center wavelength given by the center wavelength of the reflective volume holographic grating;
   Wherein the volume holographic element has the front facet that reflects the second harmonic light.

2. The apparatus of claim 1 wherein the non-linear crystal is a bulk phase matched material such as KTP, LBO.

3. The apparatus of claim 1 wherein the non-linear crystal is a quasi-phase matched bulk material such as periodically poled lithium niobate (ppln) or periodically poled lithium tantalate (pplt).

4. The apparatus of claim 1 wherein the non-linear crystal is a waveguide quasi-phase matched material such as periodically poled lithium niobate (ppln) or periodically poled lithium tantalate (pplt).

5. The apparatus of claim 1 wherein the non-linear crystal has both front and back facets anti-reflection coated at the fundamental and second harmonic wavelength.

6. The apparatus of claim 1 wherein the normal of the front facet of the volume holographic grating is approximately parallel to the direction of the first fundamental light.

7. The apparatus of claim 1 wherein the normal of the front facet of the volume holographic grating is tilted with respect to the direction of the first fundamental light.

8. The apparatus of claim 1 wherein the volume holographic grating has a spectral bandwidth smaller than the spectral acceptance bandwidth of the non-linear crystal.

9. The apparatus of claim 1 wherein the volume holographic grating has a curved front surface to collimate the first fundamental input light.

10. The apparatus of claim 1 wherein at least a collimating lens is positioned between the laser diode and the non-linear crystal.

11. The apparatus of claim 1 wherein all optical elements have flat surfaces that are non refractive.

12. The apparatus of claim 1 wherein the laser diode is butt coupled to the non-linear waveguide.

13. An apparatus for generating a polarized second harmonic beam via intra-cavity frequency doubling, the apparatus comprising:

an unpolarized laser diode having a back facet, forming one end of the optical cavity, a front facet, a gain medium between the back and front facet wherein first light is generated, the first unpolarized light having a fundamental wavelength and spectral bandwidth;

a reflective, non dispersive, volume holographic grating forming the other end of the laser cavity, the volume holographic grating having a front facet facing the laser cavity comprising an anti-reflection coating for the first fundamental light and a high reflection coating for the second harmonic light, the normal to the front facet of the volume holographic grating making an angle approximately 45 degrees with respect to the direction of the first fundamental light;

a non-linear second harmonic crystal positioned between the laser diode and the reflective volume holographic element generating the second harmonic light;

Wherein the volume holographic element receives first fundamental light and diffracts the first fundamental light back to the laser diode, the diffracted light having a narrower bandwidth than the fundamental light, a center wavelength given by the center wavelength of the reflective volume holographic grating and only one of the parallel or perpendicular polarizations of the first fundamental light back to the laser diode Wherein the volume holographic element has the front facet that reflects the second harmonic light.

14. The apparatus of claim 13 wherein the non-linear crystal is a quasi-phase match bulk material such as periodically poled lithium niobate (ppln) or periodically poled lithium tantalate (pplt).

15. The apparatus of claim 13 wherein the non-linear crystal is a waveguide quasi-phase match material such as periodically poled lithium niobate (ppln) or periodically poled lithium tantalate (pplt).

16. The apparatus of claim 13 wherein the laser diode is butt coupled to the non-linear waveguide.

17. The apparatus of claim 13 wherein the volume holographic grating has a spectral bandwidth smaller than the spectral acceptance bandwidth of the non-linear crystal.

18. The apparatus of claim 13 wherein at least a collimating lens is positioned between the laser diode and the non-linear crystal.

19. The apparatus of claim 13 wherein all optical elements have flat surfaces that are non refractive.

* * * * *